United States Patent

[11] 3,576,475

[72] Inventor John William Kronlage
Richardson, Tex.

[21] Appl. No. 756,190
[22] Filed Aug. 29, 1968
[45] Patented Apr. 27, 1971

[73] Assignee Texas Instruments, Incorporated
Dallas, Tex.

[54] FIELD EFFECT TRANSISTORS FOR INTEGRATED CIRCUITS AND METHODS OF MANUFACTURE

5 Claims, 8 Drawing Figs.

[52] U.S. Cl. .......... 317/235, 148/175
[51] Int. Cl. .......... H01l 11/14
[50] Field of Search .......... 317/235/22, 235/22.1, 235/22.2, 235/21, 235/48.1, 235/(Official)

[56] References Cited

UNITED STATES PATENTS

| | | | |
|---|---|---|---|
| 3,474,308 | 10/1969 | Kronlage .......... | 317/235 |
| 3,465,215 | 9/1969 | Bohannon, Jr. et al. ...... | 317/235 |
| 3,246,214 | 4/1966 | Hugle .......... | 317/235 |

*Primary Examiner*—James D. Kallam
*Assistant Examiner*—Martin H. Edlow
*Attorneys*—Samuel M. Mims, Jr., James O. Dixon, Andrew M. Hassell, Harold Levine, John E. Vandigriff, Melvin Sharp, Gerald B. Epstein and Koenig, Senninger, Powers and Leavitt

ABSTRACT: P-channel field-effect transistors are described which include a silicon substrate with an N-type epitaxial layer on one face thereof and an N-type subepitaxial diffused region which extends in one direction into a P-type region in the face of the substrate and in the opposite direction into the epitaxial layer to form a junction with a P-type diffused channel region extending partially into the epitaxial layer. These P-channel transistors may constitute a portion of an integrated circuit including a complementary N-channel field effect transistor and/or vertical and surface bipolar NPN and PNP transistors and resistors. Processes are disclosed for forming such transistors wherein a P-type diffusion in an epitaxial layer and an N-type diffused subepitaxial region are further diffused to form a junction therebetween.

John William Kronlage, Inventor.
Koenig, Senniger, Powers and Leavitt, Attorneys.

FIELD EFFECT TRANSISTORS FOR INTEGRATED CIRCUITS AND METHODS OF MANUFACTURE

This invention relates to P-channel field-effect transistors and processes for fabricating such devices and more particularly to integrated circuits including complementary P- and N-channel transistors and methods for making such circuits.

It is frequently desired to fabricate differential/operational amplifiers which have high gain, a low noise figure, high output voltage swing and balanced amplifier stages. These requirements can be attained when good quality N-channel and P-channel field effect transistors as well as NPN AND PNP bipolar transistors are included on a single integrated circuit bar. However, prior differential/operational amplifier integrated circuits have not included complementary field effect transistors, have low input impedances, and less than satisfactory output stage characteristics. There are numerous other design situations that cannot be satisfactorily met by known techniques but could be advantageously resolved by providing complementary N- and P-channel field effect transistors of high quality and performance.

Among the several objects of this invention may be noted the provision of high quality and performance P-channel field effect transistors having low noise figures which may be fabricated as device per se or in an integrated circuit including a complementary N-channel field effect transistor and preferably bipolar transistors, all formed on the same monolithic chip or slice without significant degradation of these latter devices; the provision of an integrated circuit including a P-channel field effect transistor which is highly compatible and complementary with an N-channel field effect transistor formed by the same fabrication process on a single integrated circuit bar; the provision of such complementary N- and P-channel transistors which may be employed to fabricate differential/operational amplifiers having high gain, low noise, high output voltage swing and balanced amplifier stages; and the provision of methods for fabricating such P-channel transistors and integrated circuits including them, which methods permit additional design flexibility and versatility together with improved and optimized circuit performance. Other objects and features will be in part apparent and in part pointed out hereinafter.

Briefly, a P-channel field-effect transistor of this invention includes a first P-type region and an N-type epitaxial layer over this P-type region. Within the first P-type region there is a subepitaxial N-type diffused region which extends upwardly into the epitaxial layer. A relatively heavily doped P-type diffused region extends through the epitaxial layer into contact with the first P-type region and forms an isolation ring. A P-type diffused channel region extends partially through the epitaxial layer within the isolation ring to form a junction with the upper portion of the N-type subepitaxial diffused layer and an N-type diffused control gate region is provided in the P-type diffused channel region and extends partially therethrough. P-type diffused regions extend partially through the P-type diffused channel region and are spaced from the edges thereof to form source and drain contacts for the transistor. The first P-type region may be a portion of a lightly doped P-type silicon substrate or a P-type diffused region in one face of a lightly doped N-type silicon substrate.

In accordance with this invention such P-channel field effect transistors are fabricated by performing a first N-type diffusion into a first P-type region underlying the area where the P-type field effect transistor is formed thereby to form a first N-type region therein. An N-type epitaxial layer is formed over these regions. Into this epitaxial layer a P-type diffusion is made to form a P-type diffused channel region extending partially through the epitaxial layer. Another P-type diffusion into the epitaxial layer is made to form a relatively heavily doped P-type region extending through the epitaxial layer into the first P-type region to form a relatively heavily doped P-type isolation ring extending around the first N-type region. By a further diffusion the P-type channel region is diffused downwardly into the epitaxial layer and the N-type region is concurrently diffused upwardly into said epitaxial layer to form a junction between this channel region and the first N-type region is Preferably this further diffusion is effected by the conditions causing this last P-type diffusion. Source and drain contacts are formed for the transistor by performing a further P-type diffusion to provide two P-type diffused regions extending partially through the diffused channel region, and then a second N-type diffusion is made into the P-type diffused channel region to extend partially into this region thereby to form a control gate region.

The invention accordingly comprises the products and methods hereinafter described, the scope of the invention being indicated in the following claims.

In the accompanying drawings, in which various possible embodiments of the invention are illustrated, FIG. 1 is a schematic or representational cross section of a substrate illustrating P-type diffused regions of different circuit devices formed in the first of several successive steps of the present invention in which the several devices are concurrently fabricated;

Corresponding reference characters indicate corresponding parts throughout the several views of the drawings.

Referring now to FIGS. 1—7 of the drawings, the starting material for a first method of fabricating the devices or integrated circuits of this invention is a slice or substrate 10 sawed from single crystal silicon about 3°—5° off of 1-1-1 orientation and lightly doped with a suitable N-type dopant, such as phosphorus, and having a typical resistivity of approximately 10—20 ohm-cm. It is mechanically polished to a mirror smooth finish and thermally oxidized at a temperature of typically about 1200° C. Throughout the following description conventional techniques of photoresist operations, masking, etching and acid clean-up steps are utilized, all as well known to those skilled in this art, and in order to avoid obscuring the important process steps and structural aspects of this invention these conventional techniques will not be described or illustrated.

The first diffusion step is carried out to form P-type conductivity regions 12*a—d* (FIG. 1) into one face of substrate 10 in the areas or zones NC, PC, NPN and PNP defined by appropriate diffusion windows (not illustrated) in a conventional masking layer. A P-type impurity, such as boron, is employed in this conventional diffusion step (e.g., boron tribromide at 850° C. for about one hour followed by heating in an oxygen atmosphere at 1250°C for about 40 hours) simultaneously to form these first P-type regions 12*l—d* in substrate 10, each having a depth of about '100 lines and a surface concentration of approximately 1016 atoms/cm$^3$. Region 12*a* will provide a back gate for an N-channel FET (field effect transistor) while regions 12*b*, 12*c* and 12*d* will provide electrical isolation for a P-channel FET, an NPN vertical bipolar transistor, and a PNP surface bipolar transistor, respectively.

Figures 1, 2, 3, 4:
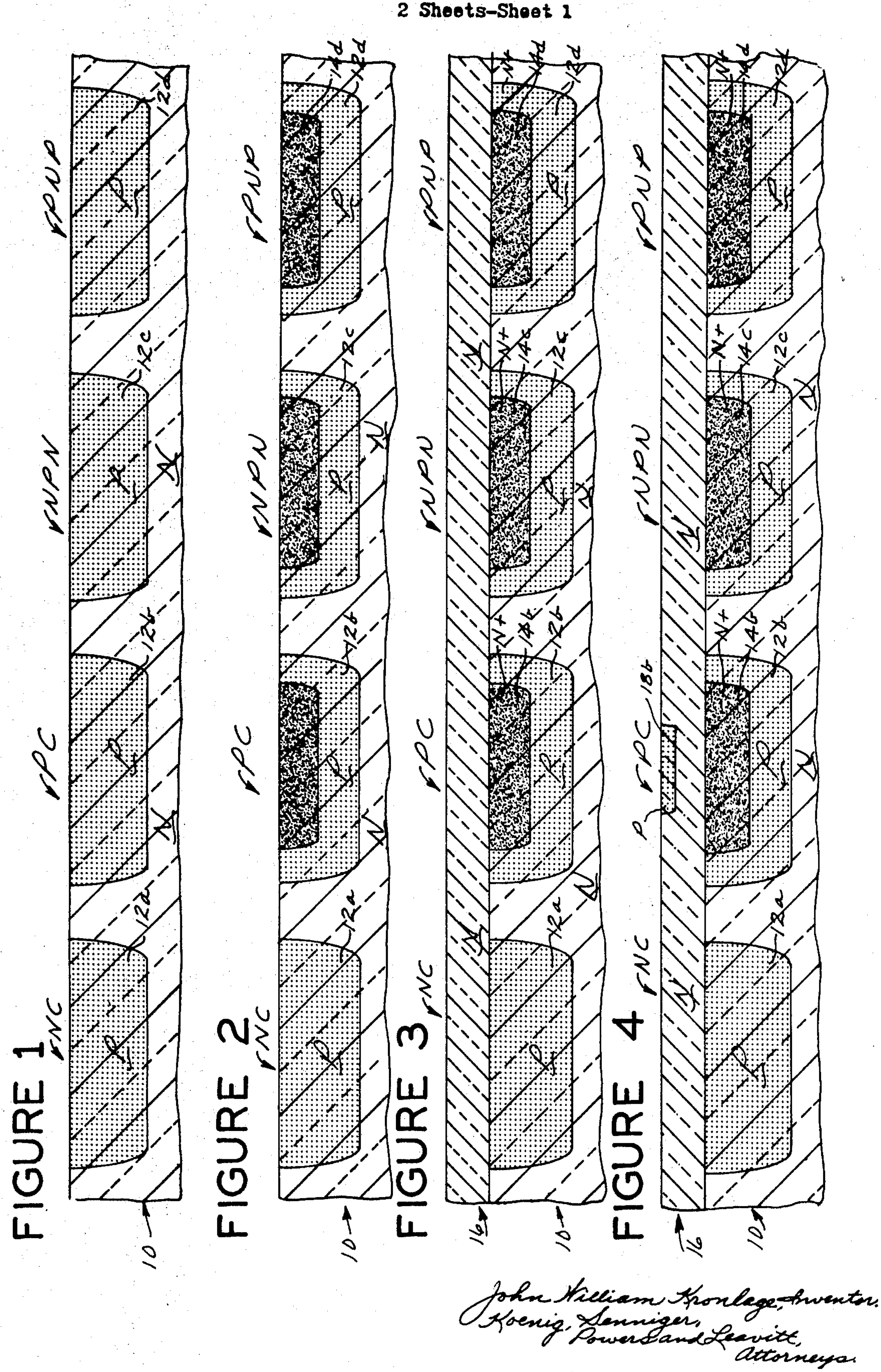
FIG. 2 shows the regionally diffused substrate of FIG. 1 including further diffused $n+$ subepitaxial regions formed in a subsequent process step.
FIG. 3 illustrates the substrate of FIG. 2 following the formation of an epitaxial layer.
FIG. 4 shows the substrate of FIG. 3 after a second P-type diffusion step.

A first N-type diffusion is performed through appropriate windows (not shown) in zones PC, NPN and PNP to effect a relatively slow diffusion of an N-type diffusant (such as antimony or arsenic) by conventional diffusing techniques to form subepitaxial *n+* regions 14*b*, 14*c* and 14*d* (FIG. 2). These regions are relatively heavily doped, having a surface concentration of about $10^{19}$ atoms/cm.$^3$ and extend into P-type regions 12*b*—*d* about 50 lines. Region 14*b* forms a back gate for the P-channel FET being formed in zone PC. Region 14*c* forms a low resistivity subsurface path for current to the collector region of the NPN transistor being formed in zone or substrate portion NPN. Region 14*d* serves to prevent parasitic PNP action relative to substrate 10. The oxide layers resulting from this diffusion are removed and the slice surface is cleaned and prepared for epitaxial layer growth.

A lightly doped N-type epitaxial layer 16 is then grown (FIG. 3) to a depth of about 0.35—0.40 mils. by any suitable customary epitaxial process, such as thermally decomposing Trichloride silane in a hydrogen atmosphere containing a few parts per million of arsene. The resistivity of epitaxial layer 16 is in the order of 2—4 ohm-cm. A second P-type diffusion is then performed through a window (not shown) to extend partially through epitaxial layer 16 in zone PC (FIG. 4) to form a lightly doped P-type region 18*b*. Again this is done by conventional diffusion methods such as by a relatively low temperature (e.g., 850° C.) diffusion for about 1 hour using boron tribromide in nitrogen as the impurity source followed by heating in a steam atmosphere at 1000° C. for another 1—2 hours. The depth of this P-type diffused region is about eight lines and has a surface concentration of approximately $10^{16}$ atoms/cm$^3$. This region will form the channel region of the P-channel FET.

Figures 5, 6, 7, 8:
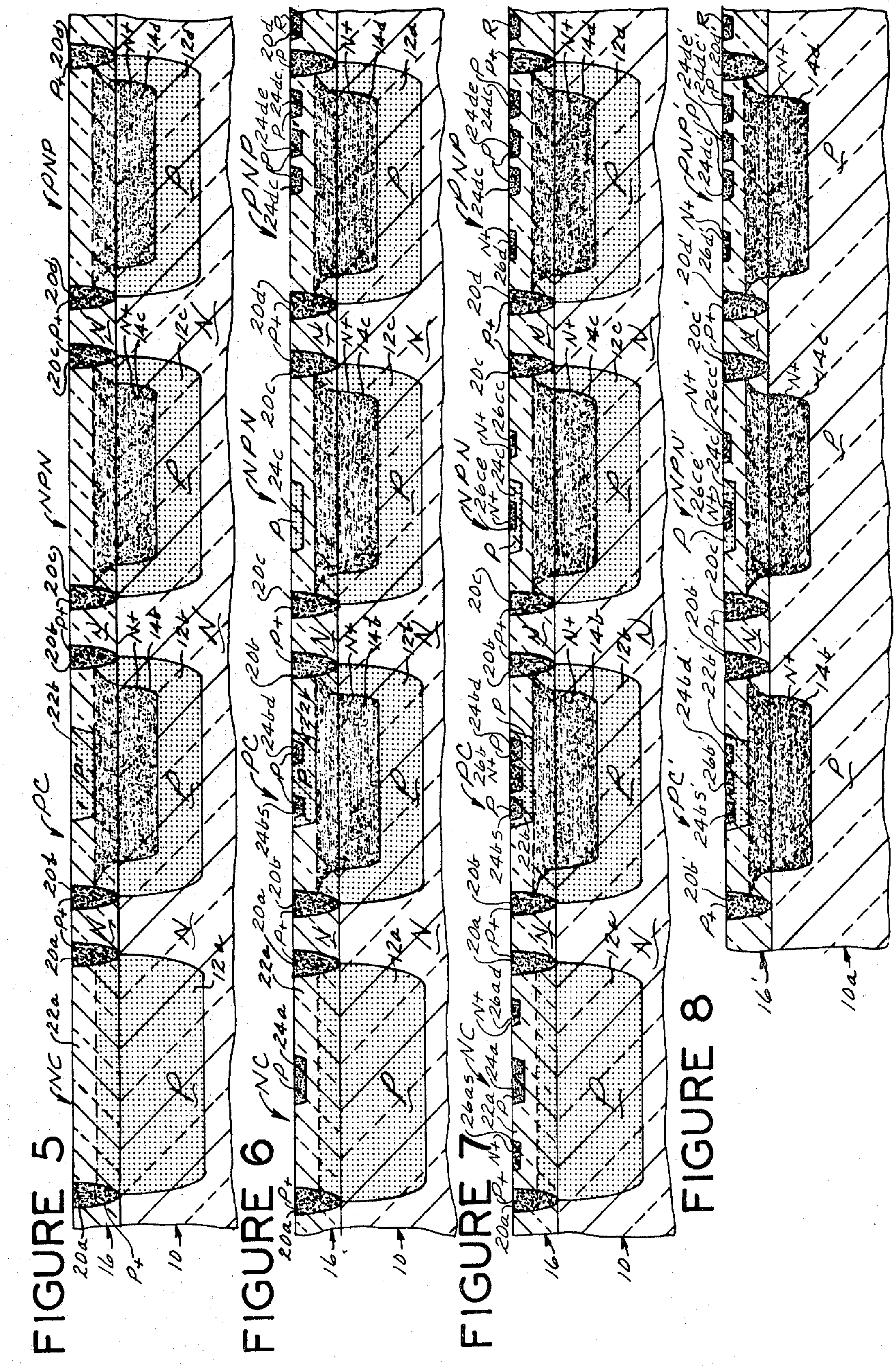
FIG. 5 illustrates the substrate of FIG. 4 after a third P-type diffusion to form isolation rings and after the P-type region of FIG. 4 is further diffused or driven further into the epitaxial layer while the opposing $n+$ region is advanced to form a junction therewith.
FIG. 6 shows the substrate of FIG. 5 after a fourth P-type diffusion.
FIG. 7 illustrates the substrate of FIG. 6 following a second N-type diffusion.
FIG. 8 is a schematic or representational cross section of a substrate illustrating another embodiment of this invention.

After removing narrow bands of the resulting oxide (on the upper face of layer 16) around the peripheries of zones NC, PC, NPN and PNP, a P-type dopant, e.g., boron, is diffused into and through the epitaxial layer 16 to form heavily doped *p+* barrier or isolation rings 20*a*—20*d* (FIG. 5) which contact the peripheries of P-type regions 12*a*—20*d* respectively, and which have a surface concentration of about 10°atoms/cm$^3$. This diffusion is performed by heating the slice 10, for example, in an atmosphere of boron tribromide in nitrogen at a temperature of 1150° C. for about an hour followed by further heating in an oxygen atmosphere at 1250° C. for about another 2 hours. Not only are the P-type barrier rings 20*a*—20*d* formed (which permits effective isolation epitaxial each of the devices from the N-type substrate by reverse biasing), but this effects a further diffusion which drives the *N+ regions 14b*— upwardly into the epitaxial layer as indicated by the dashed lines in FIG. 5, Concurrently this further diffusion causes the lower or opposing surface of P-type region 18*b* to move downwardly about seven lines to form a junction or interface with N-type region 14*b*. It is to be understood that this further diffusion may be performed independently instead of concurrently with the fourth diffusion forming the barrier or isolation rings. It will also be noted that the first P-type regions 12*a*—12 also are driven upwardly as indicated in FIG. 5 by the dashed lines. As the epitaxial layer 16 is about 0.35 mils. or about 30 lines in depth and the fronts of P-type regions 12*a* and 12*b* and the front of the *n+* region 14*b* have moved or further diffused upwardly about 15 lines, this provides channel regions 22*a* and 22*b* in zones NC and PC of about 15 lines in depth. That is, the fronts of regions 12*a*, 12*b* and 14*b* at the interfaces between these regions and the undersurface of the epitaxial layer 16 move at substantially the same rate upwardly into layer 16 and at a rate somewhat more rapid than the downward advancing of the lower face of region 18*b*. Thus the depths (the distances between the top of epitaxial layer 16 and the advanced fronts of regions 12*a*, 12*b* and 14*b*) of channels 22*a* and 22*b* of both the N-channel and P-channel FETs being formed are substantially identical. Thus, this further diffusion step permits an advantageous close and convenient control of the depths of these channel regions and provides a marked improvement in the quality and characteristics of the N- and P-channel FETs fabricated in accordance with this invention.

A further P-type diffusion is performed (FIG. 6) by conventional methods (e.g., boron tribromide at 975° C. for about one-half hour followed by further heating at 1150° C. for about 1 hour) to convert the N-type epitaxial layer 16 in regions 24*a*, 24*bs*, 24*bd*, 24*c*, 24*dc*, 24*de* and R to P-type regions having a depth of about eight lines and a typical concentration (boron) of about 5×$10^{18}$ atoms/cm$^3$. Region 24*a* of zone NC constitutes a diffused front gate of the N-channel FET being formed and is of strip form intersecting isolation ring 20*a* which is in turn electrically connected to the back gate region 12*a*. Regions 24*bs* and 24*bd* form the source and drain contacts of the P-channel FET being fabricated in zone PC. P-type region 24*c* forms the base of the NPN transistor in zone NPN, while region 24*dc* forms a ring-shaped collector and region 24*dc* constitutes an emitter for PNP transistor in zone PNP. Region R forms a diffused surface resistor of a desired length.

An N-type impurity, such as phosphorus, is employed in a second N-type, and final, diffusion to form relatively heavily doped (surface concentration of about $10^{21}$ atoms/cm$^3$) *N+ regions 26as*, 26*ad*, 26*b*, 26*ce*, 26*cc* and 26*d* having a depth of about six lines. Regions 26*as* and 26*ad* form source and drain contacts for the N-channel FET fabricated in zone NC, while 26*b* forms the diffused front gate region of the P-channel FET fabricated in zone PC. This region 26*b* extends into the epitaxial layer 10 in zone PC and is therefore connected therethrough to the *n+ back gate region 14b*. N+ regions 26*ce* and 26*cc* respectively form the emitter and the collector contact of the NPN vertical bipolar transistor fabricated in zone NPN. Regions 26*d* constitutes the base contact for the surface bipolar PNP transistor formed in zone PNP.

These integrated circuit devices are completed by customary selective etching and applying metal where desired by conventional evaporation and photoresist-etch techniques thereby to form the ohmic connections and interconnections and the surface metal leads desired.

Thus the above described exemplary process of the present invention not only fabricates P-channel FET devices, but concurrently fabricates high quality N-channel FET devices, which are complementary NPN and PNP transistors, and resistors all on the same monolithic integrated circuit chip. It will be understood that subepitaxial resistors and other structures known to those skilled in the integrated circuit art may be conveniently included without further substantial process steps. Also, it should be noted that if no N-channel FET is to be concurrently fabricated, a lightly doped P-type (instead of an N-type) silicon slice or substrate 10 is used for the starting material and the first P-type diffusion is omitted. The P-channel FET so fabricated effects virtually no degradation in the other devices formed on the same integrated circuit slice and provides additional design flexibility and improved circuit performance. For example, an all FET amplifier and other versatile designs optimizing performance beyond previously attainable capabilities may be fabricated in accordance with this invention. Differential/operational amplifiers so fabricated have a high gain, a low noise figure, high output voltage swing and well-balanced amplifier stages.

FIG. 8 demonstrates one aspect of flexibility of the methods of the present invention. In this instance a lightly doped P-type silicon substrate or slice 10*a* is employed as a starting material rather than the N-type slice 10. As no N-channel FET is to be formed, the first diffusion to form the P-type diffused regions 12*a*—*d* is eliminated. In FIG. 8 therefore the portions of the P-type substrate underlying the zones where devices PC′, NPN′ and PNP′ are formed constitute the first P-type regions for these devices. In all other respects the process steps for fabricating the integrated circuit of FIG. 8 are the same as described above in regard to FIGS. 1—7, the first diffusion in this latter exemplary method being the N-type diffusion to form N-type regions 14*b*′—14*d*′. The P-channel FET formed in zone PC′, the vertical bipolar NPN transistor formed in zone NPN′, and the surface bipolar PNP transistor formed in zone PNP′ are virtually respectively identical to those described in FIGS. 1—7, the reference numerals in FIG. 8 being annotated with a prime designation to refer to regions which correspond to those already described a above.

In view of the above, it will be seen that the several objects of the invention are achieved and other advantageous results attained.

As various changes could be made in the above methods and products without departing from the scope of the invention, it is intended that all matter contained in the above description or shown in the accompanying drawings shall be interpreted as illustrative and not in a limiting sense.

I claim:

1. A monolithic integrated circuit including at least two complementary channel-type field-effect transistors, comprising in combination:

a. a substrate of one conductivity type;

b. an epitaxially formed layer of said one conductivity type extending over substantially the entire area of one surface of said substrate;

c. a plurality of spaced, diffused isolation rings of opposite conductivity type extending through said epitaxial layer to said substrate so as to form a plurality of spaced, electrically isolated pockets in said epitaxial layer;

d. a plurality of spaced, diffused buried regions of opposite conductivity type formed in said substrate respectively contiguous with said isolation rings, said buried regions each being formed primarily within said substrate but at least partially within its respective pocket; and e. a plurality of spaced, diffused subepitaxial regions of said one conductivity type selectively formed within said buried regions, said diffused regions each being formed primarily within its respective buried region but partially within its respective pocket and being peripherally contiguous with the inner area of its respective isolation ring; wherein f. first and second type pockets of said epitaxial layer are formed, with said first type pockets overlying a buried region only, and said second type pockets overlying a buried region and a subepitaxial region; and wherein g. a field-effect transistor of channel type the same as said one conductivity type is formed within a first type pocket and includes diffused gate, source and drain regions formed within said first type pocket spaced from each other and spaced from their respective buried region and isolation ring; and wherein h. a field-effect transistor of channel type the same as said opposite conductivity type is formed within said second type pocket and includes:

1. a diffused channel region of said opposite conductivity type formed within said second type pocket spaced from its isolation ring but contiguous with its subepitaxial region;
2. diffused source and drain regions of said opposite conductivity type formed within said channel region spaced from each other; and
3. a diffused gate region of said one conductivity type formed within said channel region spaced from said source and drain regions.

2. The monolithic integrated circuit of claim 1 wherein said one and opposite conductivity types are respectively N-type and P-type, and wherein said first and second field-effect transistors are respectively N-channel and P-channel.

3. The monolithic integrated circuit of claim 1 and further including:

a. an NPN transistor formed within one of said second type pockets and including:

1. a diffused collector region of said opposite conductivity type formed within said one of said second type pockets spaced from its respective isolation ring, buried region and subepitaxial region;
2. a diffused emitter region of said one conductivity type formed within said collector region; and
3. a diffused base contact region of said one conductivity type formed within said one of said second type pockets spaced from said collector region and from its respective isolation ring, buried region and subepitaxial region; wherein b. the remaining area of said one of said second type pockets being the base region of said NPN transistor.

4. The monolithic integrated circuit of claim 1 and further including:

a. a PNP transistor formed within one of said second type pockets and including:

1. a ring-shaped diffused collector region of said opposite conductivity type formed within said one of said second type pockets spaced from its respective isolation ring, buried region and subepitaxial region;
2. a diffused emitter region of said opposite conductivity type formed within said one of said second type pockets within but spaced from said ring-shaped collector region; and
3. a diffused base contact region of said one conductivity type formed within said one of said second type pockets spaced from said ring-shaped collector region and from its respective isolation ring, buried region and subepitaxial region; wherein b. the remaining area of said one of said second type pockets being the base region of said PNP transistor.

5. The monolithic integrated circuit of claim 1 and further including a diffused resistor of said opposite type conductivity formed within said epitaxial layer remote from said first and second type pockets.